US011778800B2

(12) United States Patent
Fukao et al.

(10) Patent No.: US 11,778,800 B2
(45) Date of Patent: Oct. 3, 2023

(54) ARTICLE MANAGEMENT APPARATUS AND ARTICLE MANAGEMENT METHOD

(71) Applicant: FUJI CORPORATION, Chiryu (JP)

(72) Inventors: Kazuya Fukao, Toyota (JP); Kazuyuki Ishiyama, Iwakura (JP); Fumitaka Kato, Nagoya (JP); Tomoko Ozaki, Chita-gun (JP)

(73) Assignee: FUJI CORPORATION, Chiryu (JP)

( * ) Notice: Subject to any disclaimer, the term of this patent is extended or adjusted under 35 U.S.C. 154(b) by 242 days.

(21) Appl. No.: 17/427,367

(22) PCT Filed: Feb. 15, 2019

(86) PCT No.: PCT/JP2019/005510
§ 371 (c)(1),
(2) Date: Jul. 30, 2021

(87) PCT Pub. No.: WO2020/166053
PCT Pub. Date: Aug. 20, 2020

(65) Prior Publication Data
US 2022/0030752 A1    Jan. 27, 2022

(51) Int. Cl.
*H05K 13/08* (2006.01)
*H05K 13/04* (2006.01)
*H05K 13/02* (2006.01)

(52) U.S. Cl.
CPC ....... *H05K 13/085* (2018.08); *H05K 13/0419* (2018.08); *H05K 13/0857* (2018.08);
(Continued)

(58) Field of Classification Search
CPC ............. H05K 13/021; H05K 13/0417; H05K 13/0419; H05K 13/084; H05K 13/085;
(Continued)

(56) References Cited

U.S. PATENT DOCUMENTS

2016/0170407 A1    6/2016  Nakazono et al.
2016/0205822 A1*   7/2016  Ohashi ............... G05B 19/4083
                                                               700/97
2018/0277153 A1    9/2018  Toritani

FOREIGN PATENT DOCUMENTS

JP    2005-159164 A    6/2005
JP    2007-311546 A    11/2007
(Continued)

OTHER PUBLICATIONS

International Search Report dated May 21, 2019 in PCT/JP2019/005510 filed on Feb. 15, 2019, 2 pages).

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

An article management apparatus allocates articles necessary for a board working machine out of the articles stored in a storage based on a production plan of the board working machine that performs a predetermined board work on the board to produce the board product. The article management apparatus includes a first setting section, a second setting section, and a selecting section. The first setting section allows a user of the board working machine to set a restriction condition for each production plan of the board product. The second setting section allows the user to set a priority among multiple priority elements when allocating the articles for the articles needed in a case of producing the board product under the restriction condition set by the first setting section. The selecting section allocates the articles based on the priority of the priority element set by the second setting section.

9 Claims, 6 Drawing Sheets

(52) U.S. Cl.
CPC ......... *H05K 13/021* (2013.01); *Y10T 29/4913* (2015.01); *Y10T 29/53174* (2015.01)

(58) Field of Classification Search
CPC ............. H05K 13/0857; H05K 13/086; H05K 13/087; H05K 13/0882; H05K 13/0895; Y10T 29/4913; Y10T 29/53174; Y10T 29/53178; Y10T 29/53183; G05B 19/41865; G05B 2219/45026; G06F 3/0631; B65G 1/137; B65G 1/1371

See application file for complete search history.

(56) References Cited

FOREIGN PATENT DOCUMENTS

| | | |
|---|---|---|
| JP | 2016-115739 A | 6/2016 |
| JP | 2017-208408 A | 11/2017 |
| JP | 2018-164018 A | 10/2018 |

\* cited by examiner

Fig. 5

ALLOCATION SETTING

PRIORITY ↑ ↓

|   | PRIORITY ELEMENT PE1 | AVAILABILITY |
|---|---|---|
| 1 | RECEIVING DATE OF ARTICLE 21 | No Yes |
| 2 | LOCATION OF ARTICLE 21 | No Yes |
| 3 | REMAINING NUMBER OF ARTICLE 21 | No Yes |

RESTRICTION CONDITION RC1

| USE OF REMAINING | No Yes |
|---|---|
| USE OF SPLIT REEL | No Yes |
| USE OF SUBSTITUTE | No Yes |
| MOVEMENT BETWEEN LINES | No Yes |
| MARGIN (%) OF THE NUMBER OF USES | 3.0 |

[CONFIRMATION] [EXECUTION] [CANCEL]

Fig. 6

| ALLOCATION CONFIRMATION | | |
|---|---|---|
| COMPONENT TYPE | NUMBER OF STOCKS | REQUIRED NUMBER |
| PA1 | 50,000 | 1,000 |
| PA1a | 10,000 | 300 |
| PA1b | 5,000 | 300 |
| : | : | : |
| PB1 | 30,000 | 500 |
| : | : | : |
| PC1 | 0 | 300 |
| : | : | : |

EXECUTION    CANCEL

Fig. 7

ALLOCATION RESULT

| COMPONENT TYPE | IDENTIFICATION INFORMATION | EXPECTED NUMBER OF COMPONENTS TO BE USED | NUMBER OF ALLOCATED COMPONENTS | INSUFFICIENT NUMBER | REMAINING NUMBER |
|---|---|---|---|---|---|
| PA1 | IDA1 | 1,000 | 1,030 | 0 | 48,970 |
| PA1a | IDA2 | 300 | 309 | 0 | 9,691 |
| PA1b | IDA3 | 300 | 309 | 0 | 4,691 |
| PB1 | IDB1 | 500 | 515 | 0 | 29,485 |
| PC1 | IDC1 | 300 | 0 | 309 | 0 |
| .. | .. | .. | .. | .. | .. |

END

ARTICLE MANAGEMENT APPARATUS AND ARTICLE MANAGEMENT METHOD

TECHNICAL FIELD

The present specification discloses a technique related to an article management apparatus and an article management method.

BACKGROUND ART

The component mounter disclosed in Patent Literature 1 displays a location of a component aggregate such as a feeder and a reel according to a priority set in advance by an operator. As a result, the component mounter disclosed in Patent Literature 1, for example, is intended to be preferentially used from a component aggregate in progress.

PATENT LITERATURE

Patent Literature 1: JP-A-2005-159164

BRIEF SUMMARY

Technical Problem

However, in the component mounter disclosed in Patent Literature 1, the operator cannot set a restriction condition such as an availability of a substitute, for example. Therefore, the component mounter disclosed in Patent Literature 1 may allocate articles under a condition not desired by an operator.

In view of such circumstances, the present specification describes an article management apparatus and an article management method, which are capable of allowing a user of a board working machine to set both a restriction condition for each production plan of a board product and a priority in multiple priority elements when allocating articles, and allocating the articles necessary for a production of the board product.

Solution to Problem

The present specification describes an article management apparatus in which a board working machine allocates articles necessary for the production of a board product out of articles stored in a storage based on a production plan of the board working machine, the board working machine producing the board product by performing a predetermined board work on a board. The article management apparatus includes a first setting section, a second setting section, and a selecting section. The first setting section allows a user of the board working machine to set a restriction condition for each production plan of the board product. The second setting section allows the user to set a priority among multiple priority elements when allocating the articles for the articles needed in a case of producing the board product under the restriction condition set by the first setting section. The selecting section allocates the articles based on the priority of the priority elements set by the second setting section.

In addition, the present specification describes an article management method in which a board working machine allocates articles necessary for the production of a board product out of articles stored in a storage based on a production plan of the board working machine, the board working machine producing the board product by performing a predetermined board work on a board. The article management method includes a first setting step, a second setting step, and a selecting step. The first setting step allows a user of the board working machine to set a restriction condition for each production plan of the board product. The second setting step allows the user to set a priority among multiple priority elements when allocating the articles for the articles needed in a case of producing the board product under the restriction condition set by the first setting step. The selecting step allocates the articles based on the priority of the priority elements set by the second setting step.

Advantageous Effects

Article management apparatus includes first setting section, second setting section, and selecting section. As a result, the article management apparatus can allow a user of a board working machine to set both a restriction condition for each production plan of a board product and a priority in multiple priority elements when allocating articles, and allocating the articles necessary for the production of the board product. The above description with respect to the article management apparatus can be similarly applied to the article management method.

BRIEF DESCRIPTION OF DRAWINGS

FIG. 5 is a schematic view showing an example of setting screen of priority element PE1 and restriction condition RC1.
FIG. 6 is a schematic view showing an example of a confirmation screen.
FIG. 7 is a schematic view showing an example of an execution screen.

DESCRIPTION OF EMBODIMENTS

1. Embodiment

Figure 1:
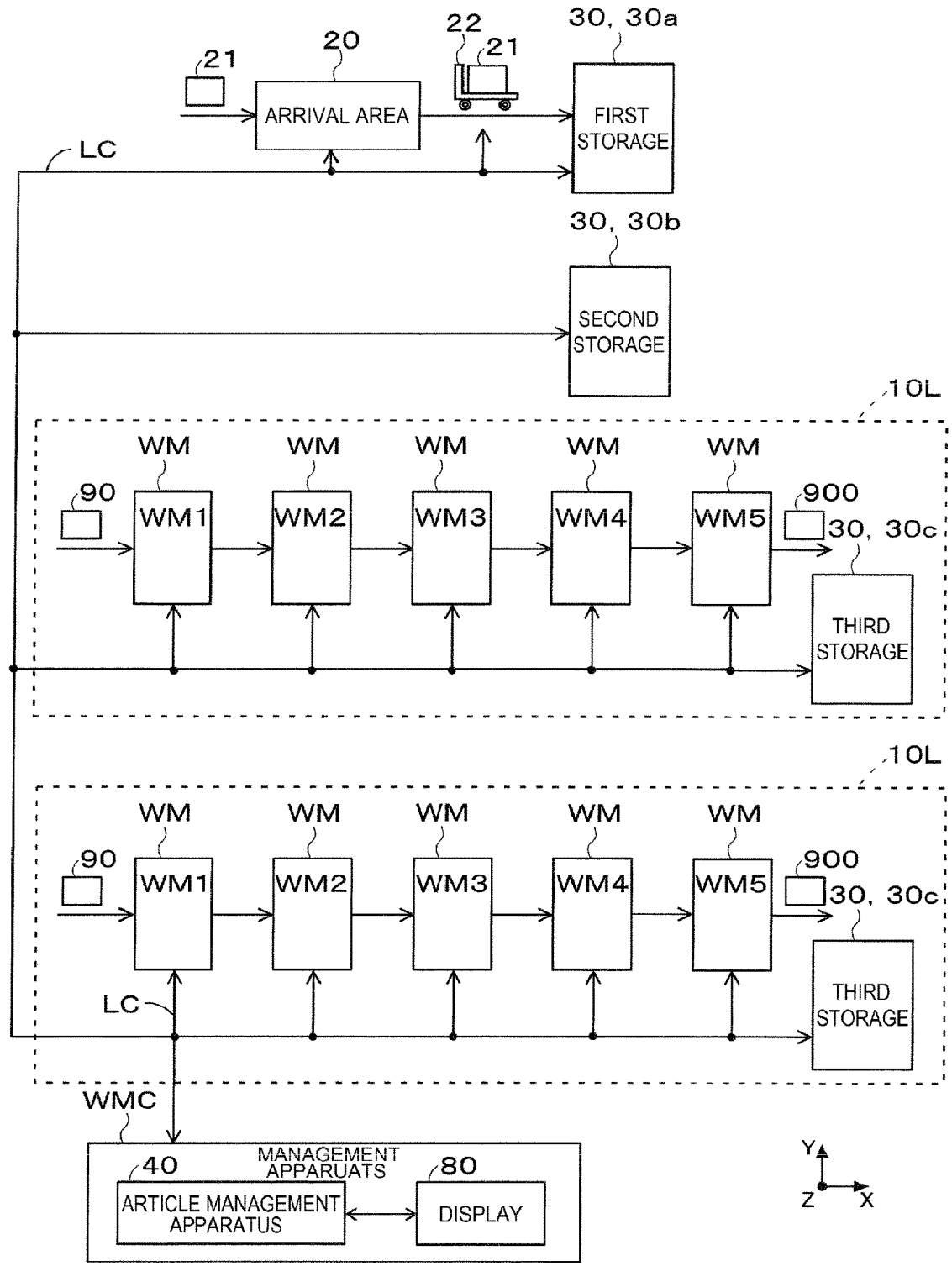
FIG. 1 is a configuration view showing a configuration example of a production facility.

As shown in FIG. 1, a production facility of the present embodiment includes at least one (two in the drawing) board working line 10L, arrival area 20, at least one (four in the drawing) storage 30, and management apparatus WMC. Article management apparatus 40 is provided in management apparatus WMC.

1-1. Configuration Examples of Board Working Line 10L and Management Apparatus WMC In each of multiple (two) board working lines 10L, a predetermined board work is performed on board 90. The type and number of board working machine WM constituting board working line 10L are not limited. As shown in FIG. 1, each of multiple (two) board working lines 10L includes multiple (five) board working machines WM of printer WM1, printing inspector WM2, component mounter WM3, reflow furnace WM4, and appearance inspector WM5, and board 90 is conveyed in this order by a board conveyance device (not shown).

Printer WM1 prints solder on board 90 at a mounting position of each of the multiple components. Printing inspector WM2 inspects a printing state of the solder which is printed by printer WM1. Component mounter WM3 mounts multiple components to board 90 (on the solder printed by printer WM1). Component mounter WM3 may be one, or may be multiple. In a case where multiple component mounters WM3 are provided, multiple component mounters WM3 can be shared to mount multiple components.

Reflow furnace WM4 heats board 90 on which the multiple components are mounted by component mounter WM3, causes the solder to melt, and performs soldering. Appearance inspector WM5 inspects a mounting state of the multiple components that are mounted by component mounter WM3. As described above, board working line 10L can convey board 90 in order using multiple (five) board working machines WM, execute a production process including an inspection process, and produce board product 900. Board working line 10L can include, as required, board working machine WM such as, for example, a function inspector, a buffer device, a board supplying device, a board flipping device, a shield mounting device, an adhesive application device, and an ultraviolet ray irradiation device.

Board working machine WM and management apparatus WMC of each of multiple (two) board working lines 10L are electrically connected by communication section LC. Specifically, communication section LC can communicably connect board working machine WM and management apparatus WMC of each of multiple (two) board working lines 10L by wired or wireless communication. In addition, as the communication method, various methods can be adopted.

In the present embodiment, a local area network (LAN) is configured by board working machine WM and management apparatus WMC in each of multiple (two) board working lines 10L. As a result, board working machine WM of each of multiple (two) board working lines 10L can communicate with each other via communication section LC. In addition, board working machine WM in each of multiple (two) board working lines 10L can communicate with management apparatus WMC via communication section LC.

Management apparatus WMC controls board working machine WM in each of multiple (two) board working lines 10L to monitor an operation status. Management apparatus WMC memorizes various control data for controlling board working machine WM of each of multiple (two) board working lines 10L. Management apparatus WMC transmits the control data to board working machine WM in each of multiple (two) board working lines 10L. In addition, board working machine WM in each of multiple (two) board working lines 10L transmits an operation status and a production status to management apparatus WMC.

1-2. Configuration Examples of Arrival Area 20

Various articles 21 arrive in arrival area 20. After articles 21 are stored in storage 30, it is supplied to board working line 10L as required. Articles 21 may be any article as long as it is used in the board work of board working machine WM, and is not limited. As described above, board working line 10L includes printer WM1 that prints the solder at the mounting position of each of the multiple components on board 90. In this case, articles 21 may be, for example, a solder container accommodating the solder.

Board working line 10L includes component mounter WM3 for mounting the components to board 90. In this case, articles 21 may be a reel around which a component tape accommodating the components is wound. In addition, articles 21 may be a feeder in which a reel is rotatably and detachably provided. Further, articles 21 may be a tray in which the components are arranged. Furthermore, articles 21 may be a holding member that holds the components. The holding member includes, for example, a suction nozzle, and a chuck.

An identification code is provided on articles 21. The identification code memorizes identification information for identifying articles 21. As the identification code, for example, a one-dimensional code, a two-dimensional code, a wireless tag, or the like can be used. When articles 21 arrives at arrival area 20, a receiving management device issues the identification information of articles 21 via article management apparatus 40 that manages articles 21. In addition, an operator of arrival area 20 reads a bar code or the like attached to articles 21 by a supplier (vendor) using a bar code reader or the like. The operator can also acquire the article information of articles 21 from a database in which the article information related to articles 21 is registered. The receiving management device memorizes the identification information and the article information of articles 21 in the identification code.

The operator of arrival area 20 attaches at least the identification code in which the identification information is memorized to articles 21, and accommodates articles 21 in an accommodation case. Then, the operator conveys the accommodation case in which articles 21 are accommodated to storage 30. In addition, at least a part of the work performed by the operator described above can be automated using a conveyance device (for example, a belt conveyor and the like), an actuator (for example, a robot arm and the like), and the like.

As the conveyance of articles 21, for example, unmanned conveyance vehicle 22 can be used. Unmanned conveyance vehicle 22 is an automatic guided vehicle (AGV) without requiring driving operation by an operator, and is driven and controlled by management apparatus WMC. In the present embodiment, multiple (two) board working lines 10L, arrival area 20, unmanned conveyance vehicle 22, storage 30, and management apparatus WMC are communicably connected by communication section LC described above. When articles 21 are mounted on unmanned conveyance vehicle 22, management apparatus WMC transmits a conveyance command to unmanned conveyance vehicle 22. When unmanned conveyance vehicle 22 receives the conveyance command, unmanned conveyance vehicle 22 conveys articles 21 to storage 30.

1-3. Configuration Examples of Storage 30

Storage 30 may take various forms as long as it can house articles 21. As shown in FIG. 1, storage 30 of the present embodiment includes three types of storage 30 for an installation location. The three types of storage 30 are denoted by first storage 30a, second storage 30b, and third storage 30c for convenience of explanation. First storage 30a is provided in the vicinity of arrival area 20. Third storage 30c is provided in each of multiple (two) board working lines 10L. Second storage 30b is provided between first storage 30a and third storage 30c.

Figure 2A:
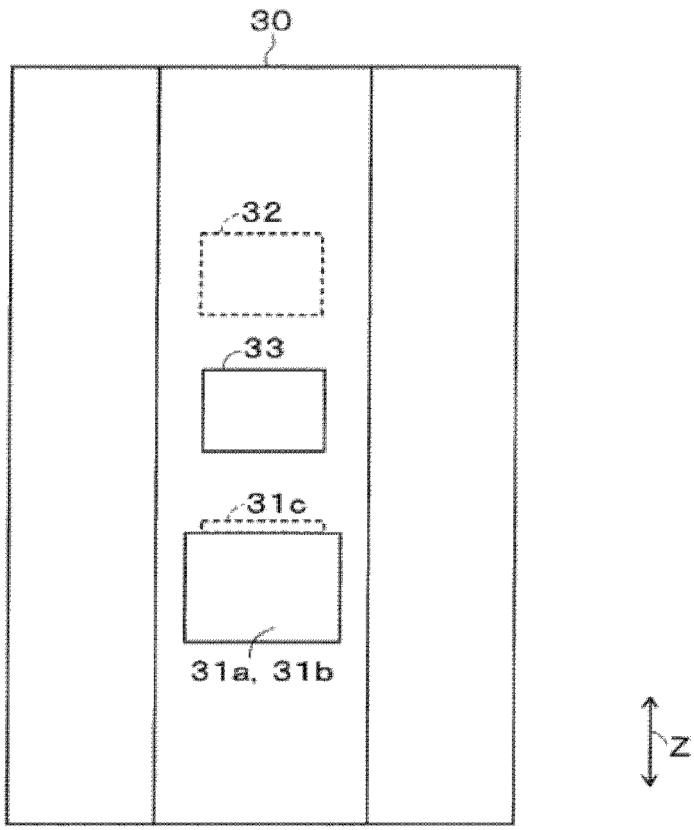
FIG. 2A is a front view showing an example of storage 30.
Figure 2B:
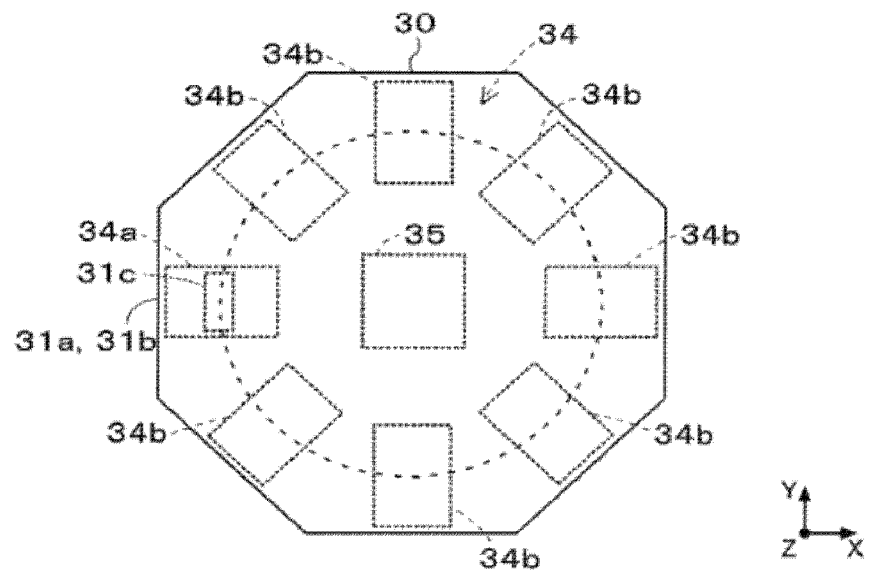
FIG. 2B is a plan view showing an example of storage 30.

The shape or the like of storage 30 is not limited. As shown in FIG. 2A and FIG. 2B, for example, first storage 30a, which is storage 30, is formed in an octagonal prism shape. Storage 30 includes warehousing port 31a, delivery port 31b, reader 31c, control device 32, display device 33, housing portion 34, and actuator 35. Articles 21 are warehoused in storage 30 from warehousing port 31a, and are delivered from delivery port 31b. In the present embodiment, warehousing port 31a and delivery port 31b are provided in a common opening portion. Warehousing port 31a and delivery port 31b may be provided in different opening portions.

Reader 31c is disposed above work space 34a that is disposed in the vicinity of the opening portions (warehousing port 31a and delivery port 31b) of storage 30. Reader 31c reads information (identification information and article information of articles 21) memorized in the identification code attached to articles 21 at least at the time of warehousing among at the time of warehousing and at the time of delivery of articles 21. Storage 30 can include multiple readers 31c.

The control device 32 includes a well-known computing device and a memory device, and constitutes a control circuit. The control device 32 is communicably connected to reader 31c, display device 33, and actuator 35, and can control them. For example, the control device 32 can control reader 31c to read the information memorized in the identification code attached to articles 21, and acquire the information read by reader 31c.

In addition, the control device 32 is communicably connected to article management apparatus 40 provided in management apparatus WMC shown in FIG. 1. Article management apparatus 40 notifies control device 32 of, for example, the occurrence of a changeover in board working line 10L, the occurrence of a shortage of articles 21 supplied to board working machine WM, or the occurrence of a possibility of a changeover or a shortage of articles 21. Based on the notification, the control device 32 causes board working machine WM to deliver articles 21 (articles 21 allocated by article management apparatus 40) necessary for the production of board product 900.

As display device 33, a well-known display device can be used, and displays various types of data so that the operator can visually recognize the data. Display device 33 displays, for example, housed object information indicating information on articles 21 housed in housing portion 34 according to an operation of the operator. The housed object information can include, for example, the type of articles 21 (for example, in a case where articles 21 are a reel, the component type of components supplied by the reel, or the like), the form, the number of stocks (remaining number), the name of the vendor, the expiration date, and the like.

Display device 33 of the present embodiment is configured by a touch panel, and display device 33 also functions as an input device of receiving various operations by the operator. For example, the operator can designate desired articles 21 to be delivered from storage 30 using the touch panel (display device 33 functioning as the input device). In this case, the control device 32 causes the designated articles 21 to be delivered.

Housing portion 34 houses articles 21. Housing portion 34 is sufficient as long as articles 21 can be housed, and the form of housing portion 34 is not limited. As shown in FIG. 2B, in the present embodiment, housing portion 34 includes multiple (seven) housing units 34b, and multiple (seven) housing units 34b are disposed in a circular shape (more accurately, in an arcuate shape) when viewed in a vertical direction (a Z-axis direction). Each of multiple (seven) housing units 34b is provided with multiple housing spaces capable of housing articles 21 along the vertical direction (Z-axis direction). The size (width, depth, and height) of the housing space is set according to articles 21 to be housed.

Actuator 35 is provided inside multiple (seven) housing units 34b when viewed in the vertical direction (Z-axis direction), and grips articles 21 to move articles 21. Actuator 35 may take various forms as long as it is can move articles 21. As actuator 35, for example, a robot arm (an articulated robot) or the like can be used.

At the time of warehousing of articles 21, actuator 35 moves articles 21 conveyed into warehousing port 31a (work space 34a) to housing units 34b provided with the housing space in which a gripping portion grips articles 21 and can house articles 21, and houses articles 21 in the housing space. In addition, at the time of delivery of articles 21, actuator 35 grips articles 21 housed in the housing space by the gripping portion, moves articles 21 to delivery port 31b (work space 34a), and conveys out articles 21. In this way, at least first storage 30a automates the warehousing work and the delivery work of articles 21.

1-4. Configuration Examples of Article Management Apparatus 40

Article management apparatus 40 allocates articles 21 necessary for board working machine WM in the production of board product 900 out of articles 21 stored in storage 30 based on the production plan of board working machine WM that performs a predetermined board work on board 90 to produce board product 900.

Figure 3:
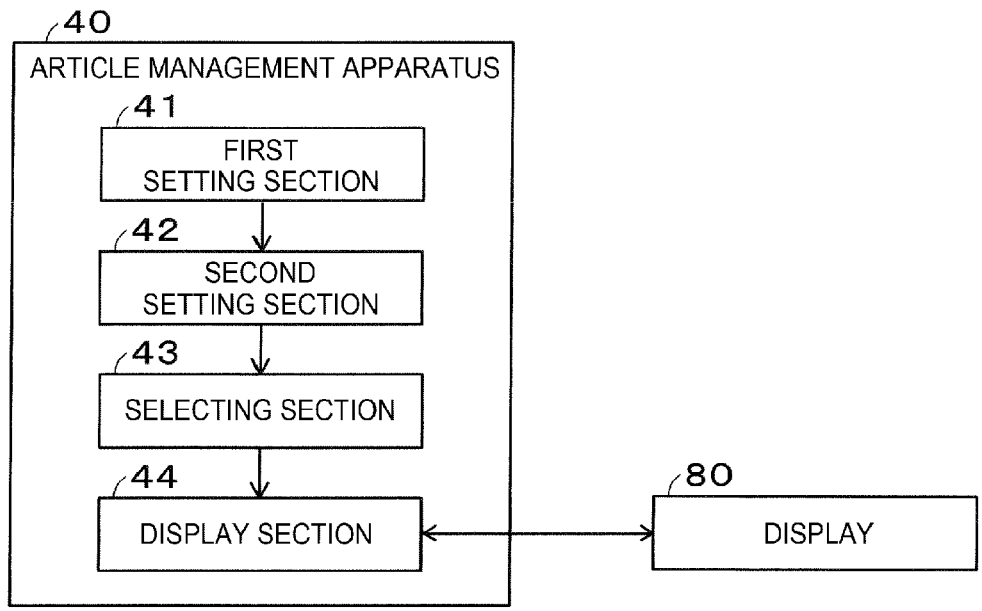
FIG. 3 is a block diagram showing an example of a control block of article management apparatus 40.

When viewed as a control block, article management apparatus 40 includes first setting section 41, second setting section 42, and selecting section 43. Article management apparatus 40 preferably further includes display section 44. As shown in FIG. 3, article management apparatus 40 of the present embodiment includes first setting section 41, second setting section 42, selecting section 43, and display section 44. In addition, as shown in FIG. 1, article management apparatus 40 of the present embodiment is provided integrally with management apparatus WMC, but article management apparatus 40 can be provided separately from management apparatus WMC.

Figure 4:
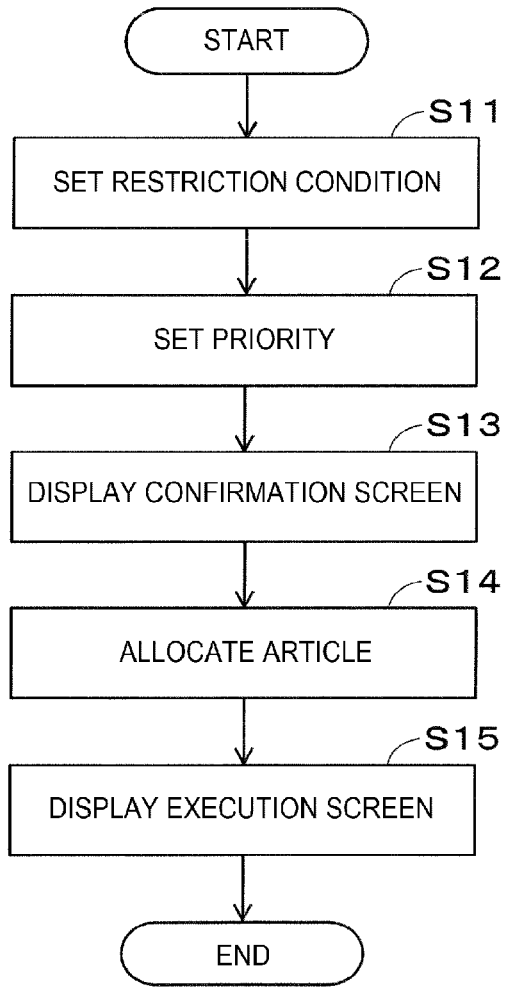
FIG. 4 is a flowchart showing an example of a control procedure by article management apparatus 40.

Article management apparatus 40 executes a control program according to the flowchart shown in FIG. 4. First setting section 41 performs the processing shown in step S11. Second setting section 42 performs the processing shown in step S12. Selecting section 43 performs the processing shown in step S14. Display section 44 performs the processing shown in step S13 and step S15.

1-4-1. First Setting Section 41

First setting section 41 allows the user of board working machine WM to set restriction condition RC1 for each production plan of board product 900 (step S11 shown in FIG. 4). The production plan is created based on the configuration of the production facility, the type of board product 900, the number of sheets to be produced, the delivery time, and the like. Since the production facility of the present embodiment includes multiple (two) board working lines 10L, the production plan includes production conditions when the predetermined number of sheets of board product 900 is produced in a predetermined period using multiple (two) board working lines 10L.

The production conditions of board product 900 include conditions related to board working line 10L to be used, board working machine WM to be used, articles 21 necessary for board working machine WM in the production of board product 900, the order of use of articles 21, and the like. For example, in a case where articles 21 are a reel, a component type, the expected number of components to be used, a position (slot) at which the reel is set, a period of use of the reel, and the like of the component supplied by the reel are included in the production conditions.

The user of board working machine WM may want to set the restriction condition in the production of board product 900. For example, the user of board working machine WM may want to restrict the use of a substitute for articles 21 in the production of board product 900. For example, in a case where articles 21 are a reel, the user of board working machine WM may want to restrict the use of the reel with different suppliers (venders) of components supplied by the reel.

Accordingly, first setting section 41 allows the user of board working machine WM to set restriction condition RC1 for each production plan of board product 900. First setting section 41 can allow a user of board working machine WM to set restriction condition RC1 from various viewpoints. For example, first setting section 41 preferably allows the user to select an availability of remaining of articles 21 generated in the production of board product 900 in the past as restriction condition RC1. As a result, article management apparatus 40 can allocate articles 21 in consideration of the desire of the user of board working machine WM for the availability of the remaining of articles 21.

FIG. 5 shows an example of a setting screen of priority element PE1 and restriction condition RC1 in a case where articles 21 are a reel. In a case where the user of board working machine WM allows the use of the remaining of articles 21 generated in the production of board product 900 in the past, the user selects Yes in an item of use of the remaining of restriction condition RC1. Conversely, in a case where the user of board working machine WM restricts the use of the remaining of articles 21 generated in the production of board product 900 in the past, the user selects No in an item of use of the remaining of restriction condition RC1.

When the user of board working machine WM selects Yes, selecting section 43 described later can include articles 21 related to the remaining of articles 21 generated in the production of board product 900 in the past in an allocation candidate. Conversely, when the user of board working machine WM selects No, selecting section 43 excludes articles 21 related to the remaining of articles 21 generated in the production of board product 900 in the past from the allocation candidate.

As described above, multiple (two) board working lines 10L, arrival area 20, unmanned conveyance vehicle 22, storage 30, and management apparatus WMC are communicably connected by communication section LC. As a result, article management apparatus 40 can grasp the location of articles 21, and can memorize a movement history of articles 21 in a memory device. Selecting section 43 can determine whether articles 21 are used in the production of board product 900 in the past by referring to the movement history of articles 21 memorized in the memory device.

Here, it is assumed that board working machine WM is component mounter WM3 for mounting components to board 90, and articles 21 are a reel around which a component tape for accommodating the components is wound, and a feeder in which the reel is rotatably and detachably provided. At this time, first setting section 41 preferably allows the user to select an availability of a split reel that splits the component tape of at least one reel and attaches the spit component tapes to multiple feeders as restriction condition RC1. As a result, article management apparatus 40 can allocate articles 21 in consideration of the desire of the user of board working machine WM for the availability of the split reel.

For the same type of component, the split reel may be used in order to enable multiple components to be simultaneously supplied from a component supply device of component mounter WM3. As a result, the cycle time of component mounter WM3 can be shortened. In a case where the user of board working machine WM allows the use of the split reel, the user selects Yes in the item of use of the split reel of restriction condition RC1. Conversely, in a case where the user of board working machine WM restricts the use of the split reel, the user selects No in the item of use of the split reel of restriction condition RC1.

Selecting section 43 can allocate at least one reel to multiple feeders when the user of board working machine WM selects Yes. In this case, the operator splits the component tape and attaches the component tape to the multiple feeders. Conversely, selecting section 43 can allocate a reel to each of the multiple feeders when the user of board working machine WM selects No. In this case, the operator attaches one reel to one feeder. Alternatively, the feeder to which the reel is already attached may be allocated.

In addition, first setting section 41 preferably allows the user to select an availability of the substitute for articles 21 as restriction condition RC1. As a result, article management apparatus 40 can allocate articles 21 in consideration of the desire of the user of board working machine WM for the availability of the substitute for articles 21.

As described above, the user of board working machine WM may want to restrict the use of articles 21 from different suppliers (venders). In addition, the user of board working machine WM may want to restrict the use of articles 21 in a specific production lot. In a case where the user of board working machine WM allows the use of the substitute for articles 21, the user selects Yes in the item of the use of the substitute for restriction condition RC1. Conversely, in a case where the user of board working machine WM restricts the use of the substitute for articles 21, the user selects No in the item of the use of the substitute for restriction condition RC1.

When the user of board working machine WM selects Yes, selecting section 43 can include the substitute for articles 21 in the allocation candidate. When the user of board working machine WM selects No, selecting section 43 excludes the substitute for articles 21 from the allocation candidate. Selecting section 43 can determine whether articles 21 are a substitute based on the article information corresponding to the identification information memorized in the identification code of articles 21.

Further, in the present embodiment, board working machine WM and storage 30 are provided in each of multiple (two) board working lines 10L. In this case, first setting section 41 preferably allows the user to select a movability of articles 21 to different board working lines 10L as restriction condition RC1. As a result, article management apparatus 40 can allocate articles 21 in consideration of the desire of the user of board working machine WM for the movability of articles 21 to different board working lines 10L.

For example, when the manufacturers of multiple (two) board working lines 10L are different from each other, the feeder that can be mounted on component mounter WM3 may be limited. Therefore, for example, in a case where articles 21 are a reel and a feeder, when the feeder to which the reel is attached is moved to different board working lines 10L, the reel may have to be detached and reattached to the feeder corresponding to the manufacturer at the destination.

In addition, even in a case where the manufacturers of multiple (two) board working lines 10L are the same, when the use time of articles 21 is close to each other, there may be a case such that the production in second board working line 10L is affected by the progress status of the production in first board working line 10L. Conversely, in a case where the manufacturers of multiple (two) board working lines 10L are the same and the use time of articles 21 is separated for a considerable period, there is no problem even when articles 21 are moved to different board working lines 10L.

In a case where the user of board working machine WM allows articles 21 to move to different board working lines 10L, the user selects Yes in the item of the movement between the lines of restriction condition RC1. Conversely, in a case where the user of board working machine WM restricts articles 21 from moving to different board working lines 10L, the user selects No in the item of the movement between the lines of restriction condition RC1.

Conversely, when the user of board working machine WM selects Yes, selecting section 43 can allow articles 21 to move to different board working lines 10L and allocate articles 21. Selecting section 43 can allocate, out of articles 21 stored in third storage 30c of board working line 10L shown in FIG. 1, for example, articles 21 necessary for board working machine WM of another board working line 10L in the production of board product 900. In addition, for example, selecting section 43 can also allocate the remaining articles of articles 21 allocated to be used by board working machine WM of first board working line 10L shown in FIG. 1 in the production of board product 900 to board working machine WM of second board working line 10L.

Conversely, when the user of board working machine WM selects No, selecting section 43 can restrict articles 21 from moving to different board working lines 10L and allocate articles 21. In this case, selecting section 43 can allocate, out of articles 21 stored in third storage 30c of one board working line 10L, for example, articles 21 necessary for board working machine WM of board working line 10L in the production of board product 900.

In addition, first setting section 41 is preferably configured to allow the user to input a margin with respect to the number of uses of articles 21 necessary for the production of board product 900 as a restriction condition. As a result, article management apparatus 40 can allocate articles 21 in consideration of the margin designated by the user of board working machine WM, so that it is possible to suppress the production stop caused by the shortage of articles 21.

Specifically, in the item of the margin (%) of the number of uses of restriction condition RC1, the user of board working machine WM inputs a margin with respect to the number of uses of articles 21 as a percentage. In the example shown in FIG. 5, 3.0 is input, and selecting section 43 allocates the number of articles 21 obtained by multiplying the number of articles 21 necessary for the production of board product 900 by 1.03.

1-4-2. Second Setting Section 42

Second setting section 42 allows the user to set the priority of multiple priority elements PE1 when allocating articles 21 for articles 21 necessary when producing board product 900 under restriction condition RC1 set by first setting section 41 (step S12 shown in FIG. 4).

Second setting section 42 can allow the user of board working machine WM to set the priority in multiple priority elements PE1 from various viewpoints. For example, second setting section 42 preferably allows the user to set the priority in multiple priority elements PE1 among a receiving date, a location, and a remaining number of articles 21. As a result, selecting section 43 can allocate articles 21 based on the priority in multiple priority elements PE1 among a receiving date, a location, and a remaining number of articles 21.

Articles 21 having a long elapsed time calculated from the receiving date of articles 21 can be said to be articles 21 stored in storage 30 for a long period without being used for the production. Accordingly, articles 21 may be preferentially used with respect to other articles 21 of the same type. In a case where the user of board working machine WM wants to include the receiving date of articles 21 in priority element PE1, the user selects Yes in the item of the receiving date of articles 21 of priority element PE1 shown in FIG. 5. Conversely, in a case where the user of board working machine WM does not want to include the receiving date of articles 21 in priority element PE1, the user selects No in the item of the receiving date of articles 21 in priority element PE1.

In the present embodiment, articles 21 arriving in arrival area 20 shown in FIG. 1 is first conveyed and stored in first storage 30a. Articles 21 stored in first storage 30a is conveyed to board working line 10L and used as required. In addition, articles 21 stored in first storage 30a can be conveyed to second storage 30b for storage as required. Further, the remaining of articles 21 used in board working line 10L is first conveyed and stored in third storage 30c. Then, articles 21 stored in third storage 30c can be conveyed and stored in second storage 30b as required.

Accordingly, articles 21 unused in the production of board product 900 is easily stored in first storage 30a, and the remaining of articles 21 used in board working line 10L is easily stored in third storage 30c. Accordingly, in the production facility, articles 21 stored in storage 30 closer to board working machine WM are more likely to contain the remaining articles. Accordingly, articles 21 stored in storage 30 closer to board working machine WM may be preferentially used with respect to other articles 21 of the same type in view of the management of articles 21. In addition, articles 21 having a small remaining number may be preferentially used with respect to other articles 21 of the same type in view of the management of articles 21

In a case where the user of board working machine WM wants to include the location of articles 21 in priority element PE1, the user selects Yes in the item of the location of articles 21 of priority element PE1 shown in FIG. 5. Conversely, in a case where the user of board working machine WM does not want to include the location of articles 21 in priority element PE1, the user selects No in the item of the location of articles 21 in priority element PE1. The above description can be similarly applied to the remaining number of articles 21.

In addition, the user of board working machine WM can sequentially raise the priority of the selected priority element PE1 by selecting priority element PE1 and then selecting ↑ (up arrow). On the other hand, the user of board working machine WM can sequentially lower the priority of the selected priority element PE1 by selecting priority element PE1 and then selecting ↓ (down arrow). In the example shown in FIG. 5, Yes is selected for the location and the remaining number of articles 21, and No is selected for the receiving date of articles 21. In addition, the location of articles 21 is set to have a higher priority than the remaining number.

1-4-3. Selecting Section 43

Selecting section 43 allocates articles 21 based on the priority of priority element PE1 set by second setting section 42 (step S14 shown in FIG. 4). In the example shown in FIG. 5, selecting section 43 sets the location and the remaining number of articles 21 as priority element PE1. In addition, selecting section 43 allocates articles 21 necessary when producing board product 900 under restriction condition RC1 set by first setting section 41 with priority given to the location of articles 21 as compared with the remaining number of articles 21.

As described above, in the production facility, articles 21 stored in storage 30 closer to board working machine WM are more likely to contain the remaining articles. Accordingly, selecting section 43 is preferably allocated from articles 21 stored in storage 30 closer to board working machine WM when the priority of the location of articles 21 is higher than that of the other priority elements PE1. As a result, selecting section 43 can be allocated from the remaining article, so that the use of the remaining articles can be promoted.

In addition, selecting section 43 is preferably allocated from articles 21 stored in the storage 30 having a small remaining number of articles 21 when the priority of the remaining number of articles 21 is higher than that of other priority elements PE1. As a result, selecting section 43 can be allocated from articles 21 stored in storage 30 having the small remaining number of articles 21, so that it is possible to suppress articles 21 having a small remaining number from being dispersed and stored.

In a case where the receiving date of articles 21 is included in priority element PE1, when the priority of the receiving date of articles 21 is higher than that of other priority element PE1, selecting section 43 is preferably allocated from articles 21 having a long elapsed time calculated from the receiving date. As a result, selecting section 43 can be allocated from articles 21 stored in storage 30 for a long period without being used for the production, so that the use of the article can be promoted.

In addition, selecting section 43 preferably prohibits the allocation of articles 21 having a failure in the production of board product 900 in the past. As a result, selecting section 43 can restrict the production using the same type of articles 21 as articles 21. For example, it is assumed that in the production of board product 900 in the past, the function inspector has confirmed a failure (for example, an abnormality or the like) of a component that is article 21. In this case, selecting section 43 prohibits the allocation of components of the same type as the component. In addition, for example, it is assumed that in the production of board product 900 in the past, component mounter WM3 has confirmed that the defect rate of the picking up and mounting operation of the component using the feeder which is article 21 (or the picking up and mounting operation of the specific component) is high. In this case, selecting section 43 prohibits the allocation of the feeder (or the remaining of the component).

1-4-4. Display Section 44

Display section 44 causes display 80 to display information on articles 21 allocated by selecting section 43 (steps S13 and S15 shown in FIG. 4). As a result, the user of board working machine WM can visually recognize the information on articles 21 to be allocated. As display 80, a well-known display can be used as long as it can display the information on articles 21. In the present embodiment, as shown in FIG. 1, since article management apparatus 40 is provided in management apparatus WMC, display 80 is also used as a display of management apparatus WMC.

Display 80 is configured by a touch panel, and also functions as an input device for receiving various operations by the user of board working machine WM. For example, display section 44 can cause display 80 to display the setting screen shown in FIG. 5. The user can select and input restriction condition RC1 and priority element PE1 using the touch panel (display 80 functioning as an input device).

When the user of board working machine WM selects and inputs restriction condition RC1 and priority element PE1 on the setting screen shown in FIG. 5 and then selects confirmation, display section 44 causes display 80 to display a confirmation screen shown in FIG. 6. FIG. 6 shows an example of a result of allocating articles 21 necessary when producing board product 900 with restriction condition RC1 set in the setting screen shown in FIG. 5, based on the priority of priority element PE1 set in the setting screen shown in FIG. 5.

For example, the number of stocks of components of component type PA1 that is articles 21 are 50,000 pieces, and the required number of components of component type PA1 is 1,000 pieces. The number of stocks of components is the actual number of components stored in storage 30, and the required number of components is calculated based on the production plan described above. Similarly, the number of stocks of components of component type PB1 is 30,000 pieces, and the required number of components of component type PB1 is 500 pieces. The number of stocks of components of component type PC1 is 0 piece, and the required number of components of component type PC1 is 300 pieces.

In the example shown in FIG. 5, since the use of the substitute is permitted, the number of stocks (10,000 pieces) and the required number (300 pieces) of substitutes for components of component type PA1 (for convenience of explanation, the components of component type PA1a) are displayed. In addition, the number of stocks (5,000 pieces) and the required number (300 pieces) of substitutes for components of component type PA1 (for convenience of explanation, the components of component type PA1b) are displayed. Display section 44 may display information on other restriction conditions RC1. In addition, display section 44 is not limited to a substitute, and can display multiple allocation candidates for the same type of article 21. Further, display section 44 can display a recommended order (for example, a first candidate, a second candidate, or the like) among the multiple allocation candidates.

The user of board working machine WM can also change the required number by referring to such information. For example, the user can increase or decrease the required number for each component among the required number of components of component type PA1 (in this case, 1,600 components). In addition, when the user of board working machine WM selects cancel on the confirmation screen shown in FIG. 6, the processing returns to the setting screen shown in FIG. 5. The user of board working machine WM can reset the setting of restriction condition RC1 and priority element PE1.

When the content of the confirmation screen shown in FIG. 6 is good, the user of board working machine WM selects execution. When the user of board working machine WM selects the execution, articles 21 are actually allocated, and display section 44 causes display 80 to display the execution screen shown in FIG. 7. For example, the expected number of components to be used of component type PA1 indicated by identification information IDA1 is 1,000 pieces, and the number of actually allocated components is 1,030 pieces. The difference of 30 pieces between the expected number of components to be used and the number of allocated components correspond to the margin (3.0% in the drawing) set on the setting screen shown in FIG. 5. The insufficient number of allocations of components of component type PA1 is 0 piece, and the remaining number (the number of stocks after the allocation) is 48,970 pieces. The above description can be similarly applied to the components of component type PA1*a* indicated by identification information IDA2 and the components of component type PA1*b* indicated by identification information IDA3. In addition, the above description can be similarly applied to the components of component type PB1 indicated by identification information IDB1.

The expected number of components to be used of component type PC1 indicated the identification information IDC1 is 300 pieces, and the number of actually allocated components is 0 piece. As shown in FIG. 6, the number of stocks of the components of component type PC1 is 0 piece, which indicates that no components of component type PC1 have been allocated. Accordingly, the insufficient number of allocations of the components of component type PC1 is 309 pieces (including the margin), and the remaining number is 0 piece. In this case, the user of article management apparatus 40 or board working machine WM orders the components of component type PC1. When the user of board working machine WM selects end, the allocation of articles 21 is completed.

2. Others

Restriction condition RC1 and priority element PE1 can be set from various viewpoints. For example, second setting section 42 can include the management state of articles 21 in priority element PE1. In this case, selecting section 43 can be allocated, for example, from articles 21 in which the management state of articles 21 is not good (for example, articles 21 of which humidity is not managed in storage 30).

In addition, in a case where the priority of the priority elements PE1 is the same, selecting section 43 can allocate articles 21 based on, for example, the number of uses, the frequency of uses, and the like of articles 21. For example, selecting section 43 can be allocated from article 21 in which the number of uses or the frequency of uses of articles 21 is low. Further, selecting section 43 can be allocated from articles 21 of which the remaining number is minimized when the required number of articles 21 is secured.

3. Article Management Method

The above description with respect to article management apparatus 40 can be similarly applied to the article management method. Specifically, the article management method includes a first setting step, a second setting step, and a selecting step. The first setting step corresponds to the control performed by first setting section 41. The second setting step corresponds to the control performed by second setting section 42. The selecting step corresponds to the control performed by selecting section 43. In addition, the article management method preferably includes a display step. The display step corresponds to control performed by display section 44.

4. Example of Effects of Embodiment

Article management apparatus 40 includes first setting section 41, second setting section 42, and selecting section 43. As a result, article management apparatus 40 can allow the user of board working machine WM to set both restriction condition RC1 for each production plan of board product 900 and the priority in multiple priority elements PE1 when allocating articles 21, thereby allocating articles 21 necessary for the production of board product 900. The above description with respect to article management apparatus 40 can be similarly applied to the article management method.

REFERENCE SIGNS LIST

10L: board working line, WM: board working machine, WM3: component mounter, 21: article, 30: storage, 40: article management apparatus, 41: first setting section, 42: second setting section, 43: selecting section, 44: display section, 80: display, 90: board, 900: board product, RC1: restriction condition, PE1: priority element

The invention claimed is:

1. An article management apparatus for a board working machine producing a board product by performing predetermined board work on a board, the article management apparatus comprising:
    a computer configured to allocate articles necessary for a production of the board product among articles stored in a storage based on a production plan of the board working machine and control a delivery of the articles allocated from the storage to the board working machine, the computer comprising:
    a first setting section configured to allow a user of the board working machine to set a restriction condition for the production plan of the board product restricting which of the articles stored in the storage can be allocated for the production plan;
    a second setting section configured to allow the user to set a priority among multiple priority elements that prioritizes certain articles over other of the articles stored in the storage for allocating the articles for the production plan under the restriction condition set by the first setting section; and
    a selecting section configured to allocate the articles based on the priority of the priority elements set by the second setting section under the restriction condition set by the first setting section.

2. The article management apparatus according to claim 1, wherein the second setting section allows the user to set the priority among the multiple priority elements including a receiving date of the articles, a location of the articles, and a remaining number of the articles.

3. The article management apparatus according to claim 1, wherein
    the selecting section prohibits the allocation of the articles having a failure in the production of the board product in the past.

4. The article management apparatus according to claim 1, wherein
the first setting section allows the user to select an availability of remaining articles generated in the production of the board product in the past as the restriction condition.

5. The article management apparatus according to claim 1, wherein the board working machine is a component mounter for mounting components on the board, the articles are a reel around which a component tape for accommodating the components is wound, and a feeder in which the reel is rotatably and detachably provided, and the first setting section allows the user to select an availability of a split reel that splits the component tape of at least one reel and attaches the split component tapes to multiple feeders as the restriction condition.

6. The article management apparatus according to claim 1, wherein
the first setting section allows the user to select an availability of a substitute of the articles as the restriction condition.

7. The article management apparatus according to claim 1, wherein
each of the board working machine and the storage is provided on multiple board working lines, and
the first setting section allows the user to select a movability of the articles to different board working lines as the restriction condition.

8. The article management apparatus according to claim 1, further comprising:
a display section configured to display information on the articles allocated by the selecting section on a display.

9. An article management method for a board working machine producing a board product by performing a predetermined board work on a board, the article management method comprising:
allocating articles necessary for a production of the board product among articles stored in a storage based on a production plan of the board working machine and controlling a delivery of the articles allocated from the storage to the board working machine, the allocating comprising:
a first setting step of allowing a user of the board working machine to set a restriction condition for the production plan of the board product restricting which of the articles stored in the storage can be allocated for the production plan;
a second setting step of allowing the user to set a priority among multiple priority elements that prioritizes certain articles over other of the articles stored in the storage for allocating the articles for the production plan under the restriction condition set by the first setting step; and
a selecting step of allocating the articles based on the priority of the priority elements set by the second setting step under the restriction condition set by the first setting section.

* * * * *